United States Patent [19]

Yiu et al.

[11] Patent Number: 5,778,440
[45] Date of Patent: Jul. 7, 1998

[54] FLOATING GATE MEMORY DEVICE AND METHOD FOR TERMINATING A PROGRAM LOAD CYCLE UPON DETECTING A PREDETERMINED ADDRESS/DATA PATTERN

[75] Inventors: Tom Dang-Hsing Yiu; Ray-Lin Wan, both of Milpitas, Calif.; Yao-Wu Cheng, Taipei, Taiwan; Chung-Hsiung Hung, Hsin-Chu, Taiwan; Fuchia Shone, Hsinchu, Taiwan

[73] Assignee: Macronix International Co., Ltd., Hsinchu, Taiwan

[21] Appl. No.: 596,380

[22] PCT Filed: May 26, 1995

[86] PCT No.: PCT/US95/06762

§ 371 Date: Feb. 16, 1996

§ 102(e) Date: Feb. 16, 1996

Related U.S. Application Data

[63] Continuation-in-part of Ser. No. 325,467, Oct. 26, 1994, Pat. No. 5,526,307.

[51] Int. Cl.$^6$ ............. G06F 13/00; G11C 16/06
[52] U.S. Cl. ............ 711/154; 711/103; 711/217; 365/185.33
[58] Field of Search ............... 395/430, 494, 395/481, 421.07, 834; 365/185.11, 185.29, 185.33; 711/103, 167, 154, 217

[56] References Cited

U.S. PATENT DOCUMENTS

| | | | |
|---|---|---|---|
| 4,970,692 | 11/1990 | Ali et al. | 365/185.11 |
| 5,036,460 | 7/1991 | Takahira et al. | 711/103 |
| 5,053,990 | 10/1991 | Kreifels et al. | 711/103 |
| 5,109,492 | 4/1992 | Noguchi et al. | 395/559 |
| 5,355,464 | 10/1994 | Fandrich et al. | 365/218 |
| 5,414,664 | 5/1995 | Lin et al. | 365/218 |
| 5,414,829 | 5/1995 | Fandrich et al. | 711/101 |

*Primary Examiner*—Glenn Gossage
*Attorney, Agent, or Firm*—Mark A. Haynes; Wilson, Sonsini, Goodrich & Rosati

[57] ABSTRACT

A floating gate memory with a protocol which terminates a program load cycle upon detecting a predetermined address and/or data pattern, providing positive indication of the end of the load cycle, and eliminating the requirement for a long pulse in a controlled signal. Command logic executes a process to store a block of data in response to a sequence of addresses and data segments received at the input/output circuitry, and detects the last segment in a block of data in response to a pattern including at least one of the addresses and data segments received at the input/output circuitry. One pattern includes consecutive matching addresses. Pattern match logic included in the command logic is coupled to the input/output circuitry and stores addresses in the sequence and compares them with a next address to indicate a matching address. Alternatively, the pattern includes both matching addresses and data segments with corresponding comparator circuitry. Alternatively, the pattern comprises a command address which is outside the address field of the memory array. The command address may include all or only a high order segment of the actual data address. The floating gate memory includes a state machine which automatically programs and verifies programming of the block of data after the last segment of the block is detected, and may comprise a flash memory or electrically erasable programmable read only memory (EEPROM).

40 Claims, 10 Drawing Sheets

FLOATING GATE MEMORY DEVICE AND METHOD FOR TERMINATING A PROGRAM LOAD CYCLE UPON DETECTING A PREDETERMINED ADDRESS/DATA PATTERN

CONTINUING APPLICATION DATA

The present application is a continuation-in-part of PCT application Ser. No. PCT/US95/00077; international filing date of Jan. 5, 1995, entitled ADVANCED PROGRAM VERIFY FOR PAGE MODE FLASH MEMORY, invented by Lin, et al.; which is a continuation-in-part of U.S. application Ser. No. 08/325,467 (PCT/US94/10331), international filing date of Oct. 26, 1994, entitled FLASH EPROM INTEGRATED ARCHITECTURE, invented by Yiu, et al., now U.S. Pat No. 5,526,307.

BACKGROUND OF THE INVENTION

1. Field of the Invention

The present invention relates to floating gate memory devices, such as flash erasable programmable read only memory (EPROM) or electrically erasable programmable read only memory (EEPROM), and more particularly to such devices having automatic program cycles for programming a block of data.

2. Description of Related Art

Floating gate memory devices, such as flash memory and EEPROM, provide for electrically storing data into the device. The operation of storing data has been controlled in the prior art based on commands which consist of a sequence of addresses or data, such as described in prior art U.S. Pat. No. 4,970,692, to Ali, et al.. When a particular sequence of addresses is detected, in combination with the appropriate cycling of the chip enable and write enable signals, an automatic program mode is initiated in one prior art system. The automatic program mode includes a program load cycle in which the chip receives a stream of addresses and data which are loaded into a programming data buffer. After the block of data to be programmed has been loaded into the buffer, an automatic program cycle is executed by state machines on the chip to transfer the data into the non-volatile memory array. The problem arises in detecting the end of the block of data to be stored. In prior art systems, the end of the block of data is signaled by a pulse of the chip enable or write enable signal which lasts more than 100 microseconds. The prior art devices require further that the full buffer (i.e. 256 bytes) be loaded prior to programming.

The time out sequence, based on the long 100 microsecond pulse, is time consuming and can cause problems in computer systems. For instance, interrupt signals may occur while the memory device is performing the loading of the buffer. In this case, if the interruption is longer than the 100 microsecond waiting period, then the internal state machine on the flash memory may take over and program the data in the buffer, before the entire buffer is loaded. Thus, care must be taken in systems using flash memory to prevent interrupts which take longer than 100 microseconds to service. If the duration of interrupt servicing cannot be managed, then a problem arises which cannot be addressed using prior art systems.

Accordingly, it is desirable to provide a protocol which allows for loading a block of data having an arbitrary length into a floating gate memory device, and for detecting when the end of that block has been loaded.

SUMMARY OF THE INVENTION

The present invention provides a protocol which terminates a program load cycle in an integrated circuit memory, providing positive indication of the end of the load cycle, and eliminating the requirement for a long pulse in a control signal. The invention is based on command logic which executes a process to store a block of data in response to a sequence of addresses and data segments received at the input/output circuitry, and detects the last segment in a block of data in response to a pattern including at least one of the addresses and data segments received at the input/output circuitry. The command logic includes a command address/data latch, a command address/data decoder, and mode control logic. The input/output circuitry includes control input logic, an address latch and buffer, and data I/O circuitry. Thus, according to one aspect of the invention the pattern includes an address transition between consecutive matching addresses. The command logic also includes a circuit coupled to the input/output circuitry which stores addresses in the sequence and compares them with a next address to indicate a matching address. Alternatively, the pattern may include both matching addresses and data segments with corresponding comparator circuitry. Alternatively, the pattern may comprise a transition to a command address which is outside the address field of the memory array, or a transition of part of an address from a command value to a read value for the page. To terminate the program load cycle, the host simply sends the required pattern, such as by repeating the last address/data segment in the block. No 100 microsecond pulse is required; and a positive, quick indication that the end of the block has been reached is provided.

The integrated circuit memory according to another aspect includes a state machine which automatically programs and verifies programming of the block of data after the last segment of the block is detected.

In another alternative, the input/output circuitry receives a control signal, such as a write enable or chip enable signal, which establishes the timing for the sequence of addresses and data segments. The command logic includes a circuit to detect a pulse from the control signal having a characteristic pulse width as another way to indicate that the block is completely loaded for instance to be compatible with prior art systems. The command logic automatically programs and verifies programming of the block after the last segment in the block is detected based on pattern matching or the long pulse is detected.

The present invention is particularly applicable to floating gate memory devices which provide for page programming. According to this aspect, the invention can be characterized as a memory array of floating gate cells. The memory array includes a plurality of word lines and bit lines which are coupled to the floating gate cells in the array. Input circuitry is included which has inputs to receive addresses and data. Command logic is coupled to the input circuitry, which initiates the program process in response to a sequence of addresses and data segments received at the input circuitry, including logic to detect a last segment in the block of data in response to a pattern including at least one of addresses and data received at the input circuitry. A page buffer is included in the circuit, which is coupled to the input circuitry to store the block of data and supply the block of data to the floating gate cells in the array. Write control circuitry comprising program/erase voltage sources is coupled to the command logic, the page buffer and the word lines, which after detection of the last segment in the block, supplies programming voltages to a selected wordline for programming input data to a row of floating gate cells accessed by the selected word line in response to the input data stored in the page buffer. Finally, program/verify circuitry is included coupled with the page buffer, which verifies that the floating gate cells are programmed with the block of data in the page buffer.

In a preferred system, the page buffer includes a plurality of bit latches coupled to corresponding ones of the plurality of bit lines. The program verify circuitry includes logic coupled to the page buffer and to the bit lines, that resets bit latches to a first binary value when stored data in the floating gate cell on a corresponding bit line matches a second binary value.

The present invention can also be characterized as a method for storing a block of data consisting of less than or equal to a page in a floating gate memory device. The method includes the following:

supplying a command which indicates an automatic program operation to the memory device;

after supplying the command, supplying a stream of addresses and segments of data, and storing the supplied segments of data in a page buffer;

monitoring the stream of addresses and segments of data to detect a pattern in the stream which signals an end of the block of data; and after detection of the pattern, executing a program operation to store the block of data from the page buffer.

Accordingly, a protocol to terminate a program load cycle for a floating gate memory device, such as flash memory or EEPROM, is provided which relies on a pattern of addresses and/or data signals to signal the end of the load cycle. The protocol provides for positive indication of the end of the load cycle, so that a block of data of arbitrary length up to the size of a page can be loaded for each program cycle. Also, it eliminates the requirement of the 100 microsecond pulse used in the prior art, and is therefore inherently faster and less vulnerable to long interruptions in the cycling of the control signals.

Other aspects and advantages of the present invention can be seen upon review of the figures, the detailed description, and the claims which follow.

DETAILED DESCRIPTION

A detailed description of a preferred embodiment of the present invention is provided with respect to FIGS. 1 through 11A and 11B, in which FIGS. 1 and 3 through 6 illustrate the basic architecture and related timing diagrams of a memory device implementing the protocol to terminate a program load cycle according to the present invention based on pattern match logic. FIG. 2 illustrates a prior art timing sequence. FIGS. 7 through 11A and 11B illustrate a page program flash EEPROM device which includes the protocol of the present invention, a flow chart for the operation of page buffer bit latches in the device, and timing diagrams of alternative address patterns used to signal the end of a page load cycle.

Figure 1:
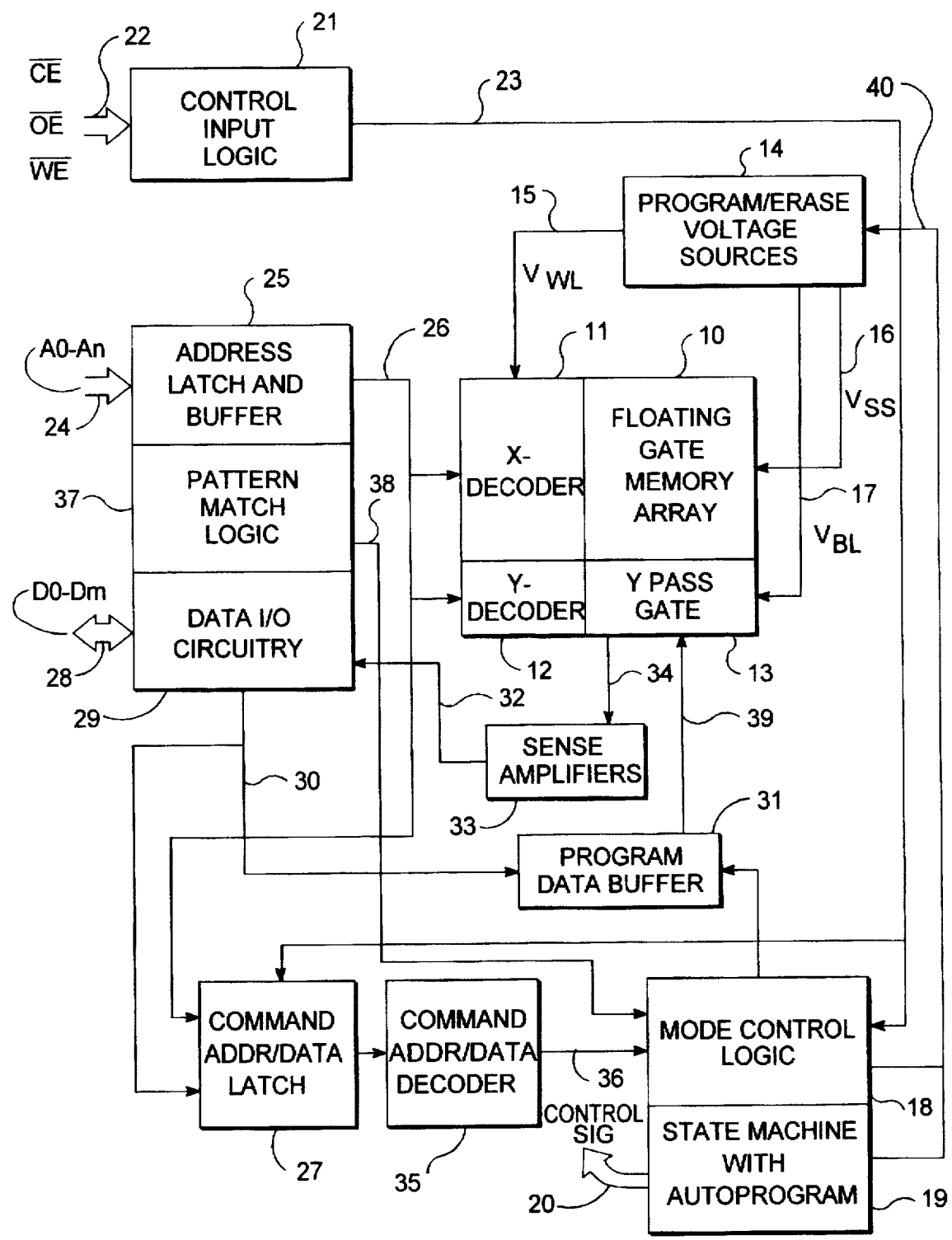
FIG. 1 is a schematic block diagram of a floating gate memory device including the pattern match logic of the present invention for indicating the termination of a program load cycle.
Figure 2:
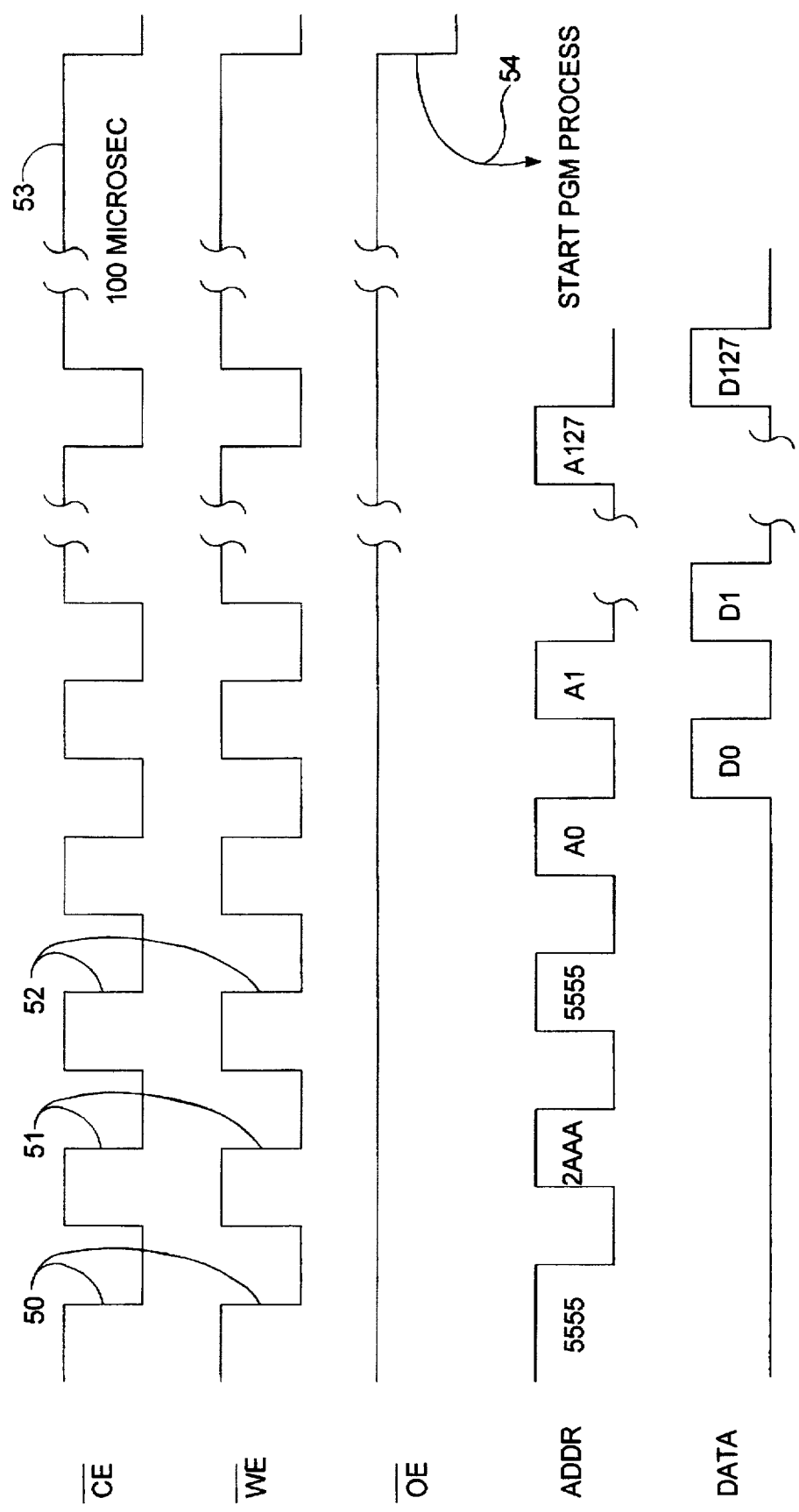
FIG. 2 illustrates the sequence used in prior art systems to indicate the end of a program load cycle.

FIG. 1 is a block diagram representing a basic floating gate memory device for an integrated circuit which includes the logic for terminating a load cycle according to the present invention. FIG. 1 is a simplified drawing of the basic components of a floating gate memory device formed on an integrated circuit. It is meant to represent the components of commercially available flash EPROM or EEPROM devices, which are supplemented with the novel pattern match logic, and protocol logic for determining the end of the program load cycle of the present invention.

Thus, the device includes a floating gate memory array 10. Coupled with the array are an X decoder 11, a Y decoder 12, and Y pass gates 13. Program and erase voltage sources 14 are coupled with the array to supply a voltage on line 15 for word lines being programmed or erased, a voltage on line 16 for source terminals of cells in the array being programmed or erased, and a voltage on line 17 for bit lines coupled to cells being programmed or erased in the array. The mode control logic 18 and state machine 19 are connected by line 40 to the program and line voltage sources 14, among other places. The mode control logic 18 and state machine 19 including an automatic program function, are included on an integrated circuit chip to control the read, erase, and program operations as known in the floating gate memory art. The state machine generates control signals generally represented by arrow 20 which manage the various operations of the device. The mode control logic is responsive to control signals received at control input logic 21 on the chip. The control inputs include, for example, a chip enable $\overline{CE}$, an output enable $\overline{OE}$, and a write enable $\overline{WE}$ signal on inputs represented by arrow 22. The control input logic supplies control signals on line 23 to the mode logic 18. Addresses are received on input bus 24, and supplied to an address latch and buffer 25. The addresses at the output of the address latch and buffer 25 are supplied on line 26 to the X decoder 11, the Y decoder 12, and to a command address/data latch 27. Input data and output data are supplied on I/O pins represented by arrow 28 through data I/O circuitry 29. The incoming data is supplied on line 30 to the command address/data latch 27, and to a program data buffer 31. Output data is received on line 32 from sense amplifiers 33, which are coupled to the Y pass gates 13 across line 34 to receive read data.

The command address/data latch 27 is coupled to a command address/data decoder 35, which decodes patterns in the incoming address and data stream which indicate certain functions to be performed. The output of the decoder is supplied on line 36 to the mode logic 18, which manages the various operations.

According to the present invention one of the operations is an autoprogram mode which involves automatically loading into the program data buffer and storing a block of data, with an automatic program verify operation.

According to the present invention, pattern match logic 37 is coupled with the address latch and buffer 25, and the data I/O circuitry 29 to indicate during the program load cycle of the autoprogram operation when the incoming stream of addresses and data segments match a pre-specified pattern, such as consecutive matching addresses, consecutive matching address/data segment combinations, or an address which matches a pre-specified command address outside the address space used in programming the floating gate memory array 10.

The output of the pattern match logic is supplied on line 38 to the mode logic 18 to signal the end of the program load cycle. At the end of the program load cycle, the state machine initiates the autoprogram process, storing the data from the program data buffer 31 across line 39 into the floating gate memory array 10, and automatically verifying the programming operation.

FIG. 2 illustrates the prior art protocol timing for determining the end of the program load cycle. According to the prior art, to initiate a program load cycle, the chip enable and write enable signals are toggled from high to low as indicated at point 50. When these signals are toggled from high to low, an input address such as hex 5555 is latched in the command address/data latch 27. In the next toggle of these signals from high to low, as indicated at point 51, a second address in the command sequence is loaded, such as hex 2AAA. The third address in the command sequence is loaded at point 52, such as hex 5555. After this sequence, the autoprogram cycle is initiated by the mode control logic 18. On each succeeding falling edge of the chip enable or write enable signal, a new address is received, such as A0, A1 . . . , A127, for a case in which there are 128 addresses in a page of data to be stored in the program data buffer 31.

On each rising edge following a particular falling edge, the data segment for the previous address is loaded, such as data segments D0, D1, . . . D127. In the prior art, after all data segments for the program data buffer 31 are loaded, then a pulse of at least 100 microseconds, such as the pulse 53, in one of the control signals is issued. After the 100 microsecond pulse, the program process for the stored data is initiated as indicated by the arrow 54 by a transition in the output enable OE signal. As discussed above in the background section of the present application, this protocol suffers the disadvantage that all segments of data in the page must be loaded for any program cycle, and the disadvantage that the 100 microsecond pulse is required to initiate the program process.

Figure 3:
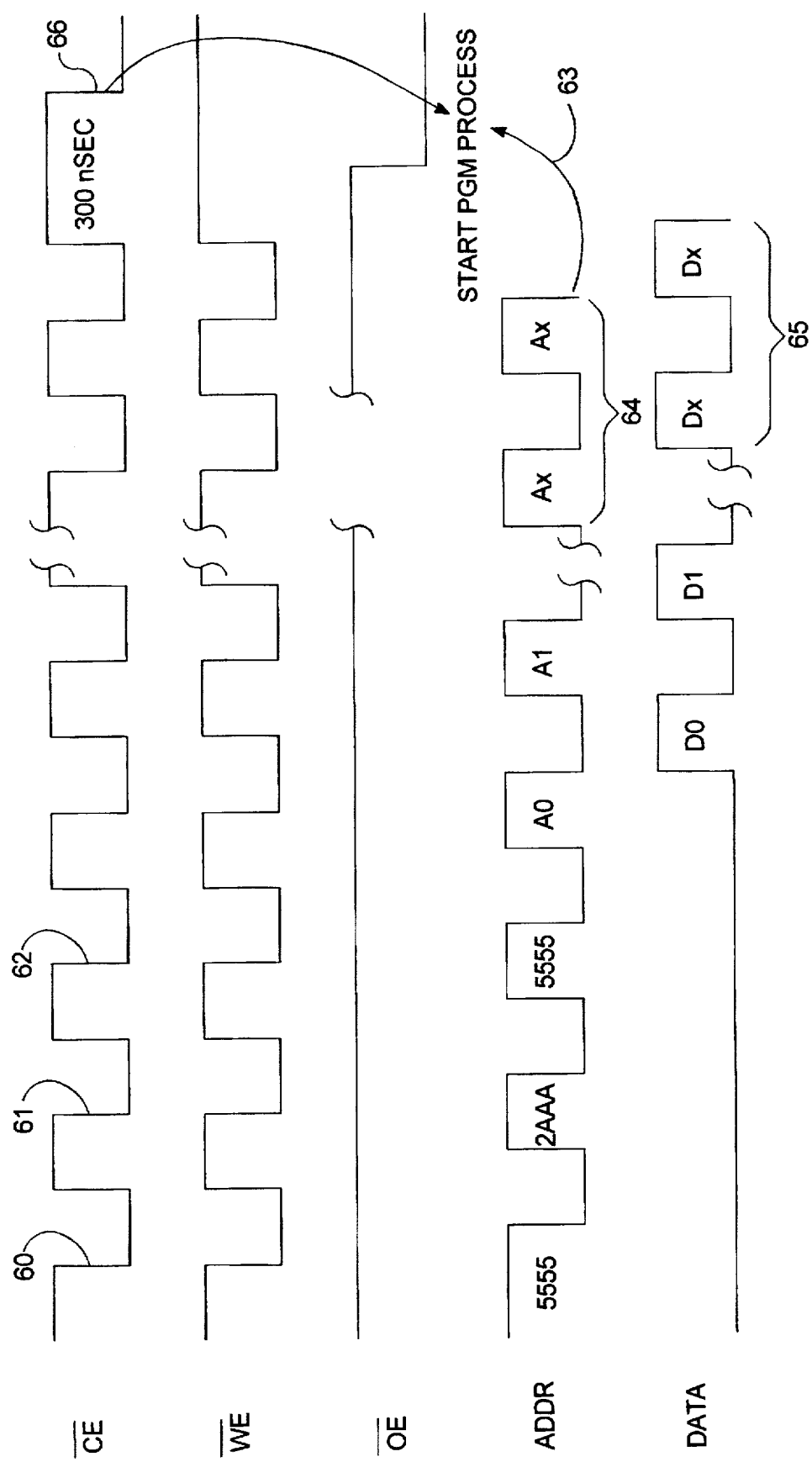
FIG. 3 illustrates the timing according to the present invention for indicating the end of a program load cycle.

FIG. 3 shows the protocol timing according to the present invention. As before, an address sequence corresponding to a command is latched on the first three falling edges of the control signals, such as at edges 60, 61, and 62. After the command sequence indicates the automatic program cycle, then a program load operation is executed in which the addresses A0, A1 through Ax are loaded on sequential falling edges of the control signal. On sequential rising edges of the control signal, the corresponding data segments D0 through D1, . . . Dx are loaded.

According to the present invention when a pre-specified pattern of addresses and/or data is detected, then the program process is begun as indicated by arrow 63. A 300 nanosecond pulse ending at edge 66 is required in this embodiment for synchronization of the state machine before the autoprogram process starts. Thus, in the illustration shown in FIG. 3 the pattern includes two sequential addresses in the address stream which match, such as Ax followed by Ax as shown in the region 64. Also, matching sequential data for the corresponding addresses as shown in the sequence 65 may be required to indicate the end of the program load segment of the autoprogram process.

This process allows for explicit indication of the end of the program load segment of the autoprogram process upon an address or data transition in the sequence. The length of the block of data being loaded can be arbitrary, from 1 byte to the full size of the page buffer.

Alternative sequences involve simply matching addresses, without requiring matching data in the stream. Alternatively, a pre-specified command address can be identified, which when occurring in an address stream during the load process, indicates the end of the stream. This command address should fall outside the address space used in the program load process.

Figures 11A, 11B:
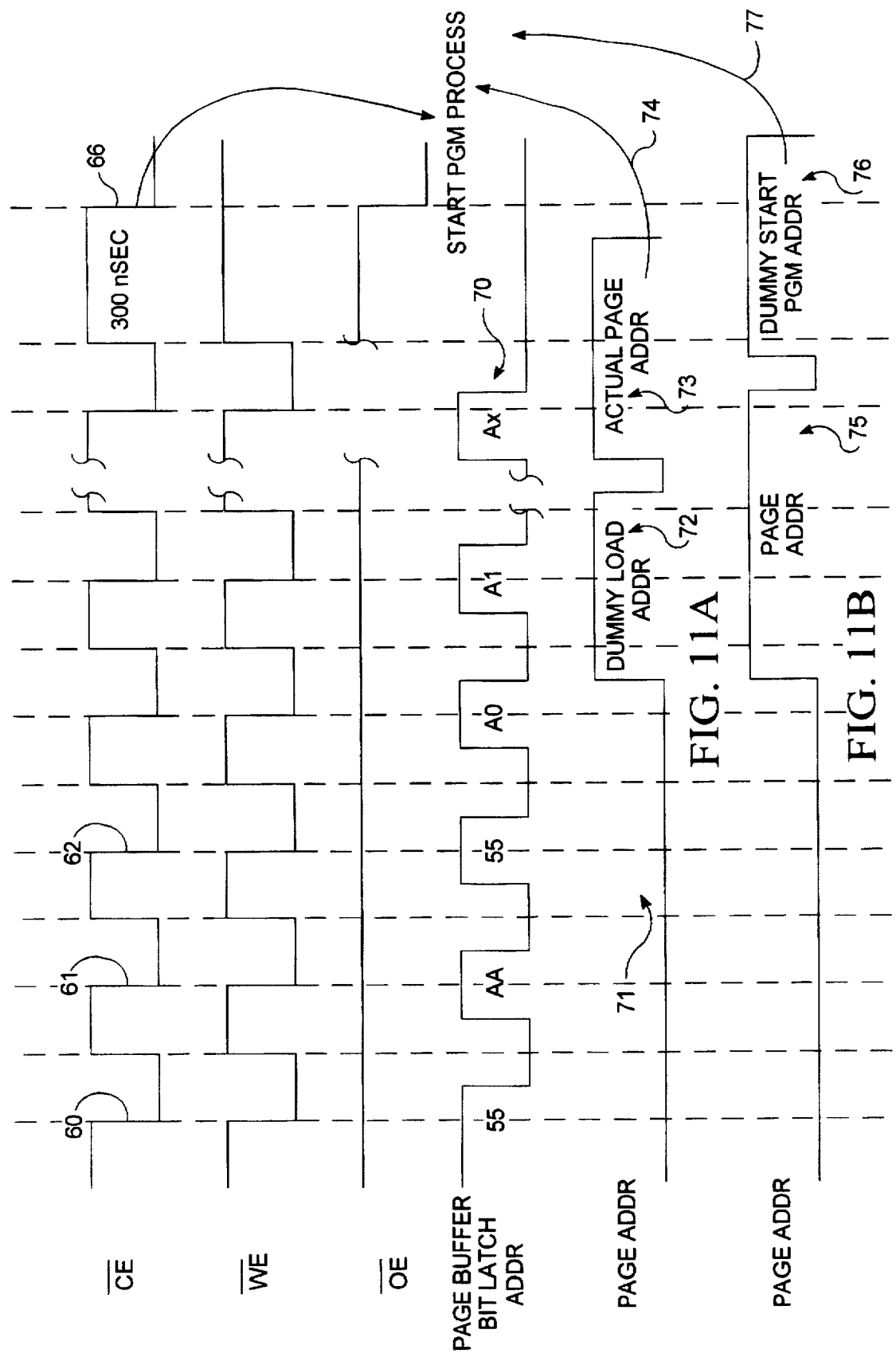
FIGS. 11A and 11B show alternative address patterns used to signal the end of a page load cycle according to the present invention.

FIGS. 11A and 11B show an alternative pattern for detecting the end of the page load process. The locations into which data is to be stored are identified by addresses within an address field for the memory device. The addresses have a page address segment and page buffer address segment. In FIG. 11A, the page buffer (or bit latch) address segment is identified by trace 70 while the page address is indicated by trace 71. As in FIG. 3, the control signals including chip enable, write enable, and output enable are switched as shown in the figure. The same reference numerals used in FIG. 3 are used in FIG. 11A where appropriate.

To begin a load cycle sequence according to this aspect of the invention, the command sequence is latched on the edges 60, 61, and 62 as before. The low order address field which stores the bit latch address will include a portion of the command code as indicated. The high order address field will include the balance of the command code (not shown). As seen in FIG. 3, the address command code to begin the load process is actually a 15 bit address (A0 to A14) rather than the 8 bit addresses indicated by the hex values 55, AA, and 55 of FIG. 11A. These two higher order fields of the command sequence could be included in the page address field shown along trace 71, or included in a field that is intermediate between the bit latch address and the page address depending on a particular implementation.

According to the pattern shown in FIG. 11A, after initiation of the load process in response to the command sequence 55, AA, 55, a dummy load address is supplied to the page address field during the interval 72. The dummy load address 72 is latched in the fourth cycle of the sequence, along with the first bit latch address A0. This load address is held constant while the sequence of bytes and bit latch addresses are loaded to define the block to be stored. In FIG. 11A, the data values are not shown. However, they will be timed just as shown in FIG. 3. In order to indicate the end of the load sequence, as shown in FIG. 11A, before the last address Ax in the sequence, the page address field on trace 71 is changed from the dummy load address 72 to the actual page address 73 within the address field for the memory. The command logic detects this transition from the dummy load address to the page address, and starts the program process as indicated by arrow 74. As in the case of the pattern of FIG. 3, a 300 nanosecond pulse ending by transition 66 in the chip enable signal is used to ensure that the state machine is synchronized to begin the programming process.

The pattern of FIG. 11A has the advantage that it does not require an extra dummy cycle in which the address and/or data are repeated as shown in FIG. 3.

FIG. 11B shows another alternative pattern which uses the page address segment of the addresses being received to indicate the end of the load cycle. According to this alternative, after detection of the command sequence indicating an automatic program, the actual page address for the data being loaded is latched as indicated in field 75. The actual page address is latched in the fourth cycle of the sequence along with the bit latch address A0. After the last byte in the sequence is loaded having the address Ax, then the page address is changed to a dummy start program address 76 which is outside the address field for the memory. The dummy start program address is detected by the command logic, which then initiates the program process as indicated by arrow 77. The 300 nanosecond pulse of the chip enable signal may be necessary again to ensure synchronization of the circuitry.

Figure 4:
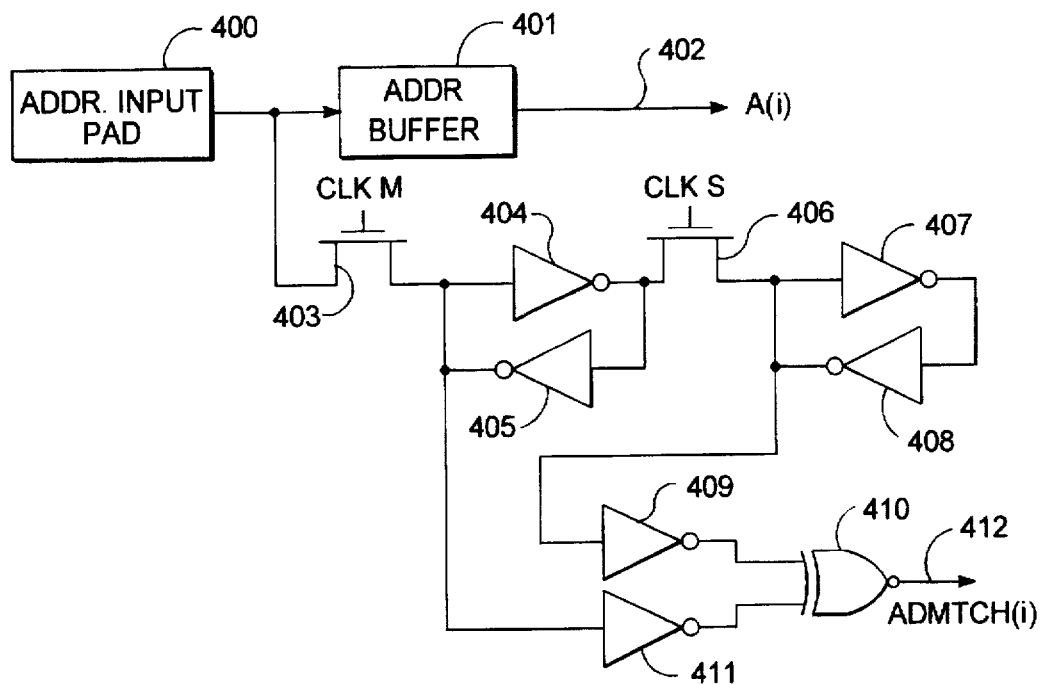
FIG. 4 is a first part of the logic for detecting matching input addresses according to the present invention.
Figure 5:
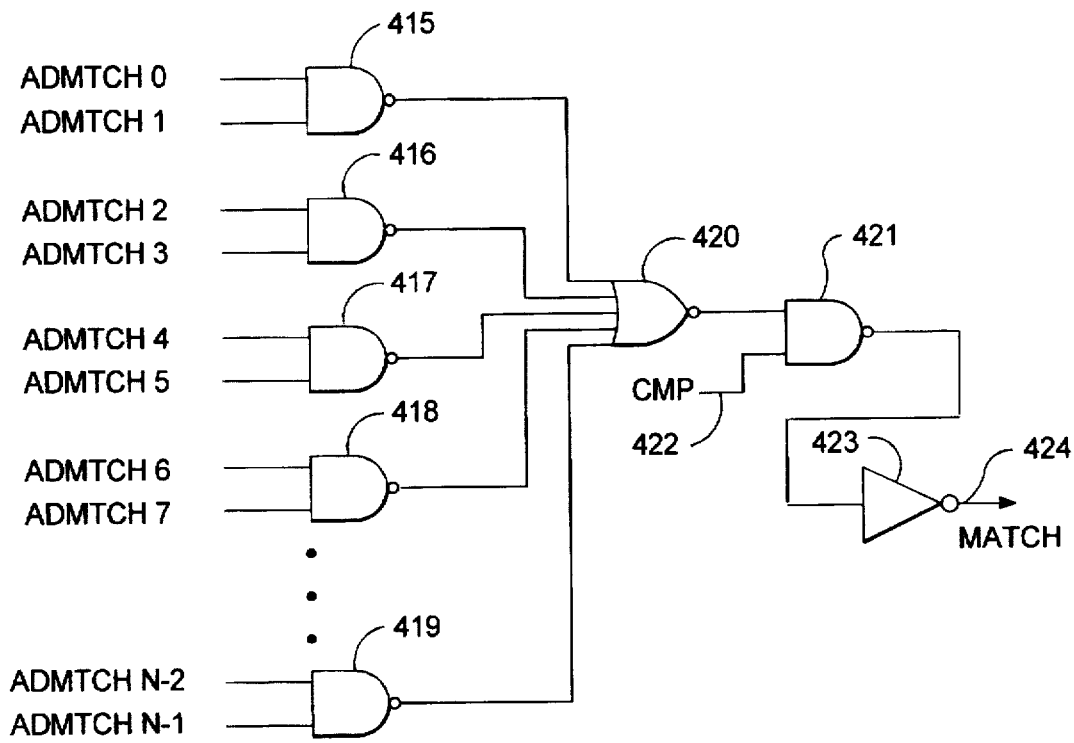
FIG. 5 is a second part of the logic used for indicating a matching sequence of addresses received at the input buffers according to the present invention.
Figure 6:
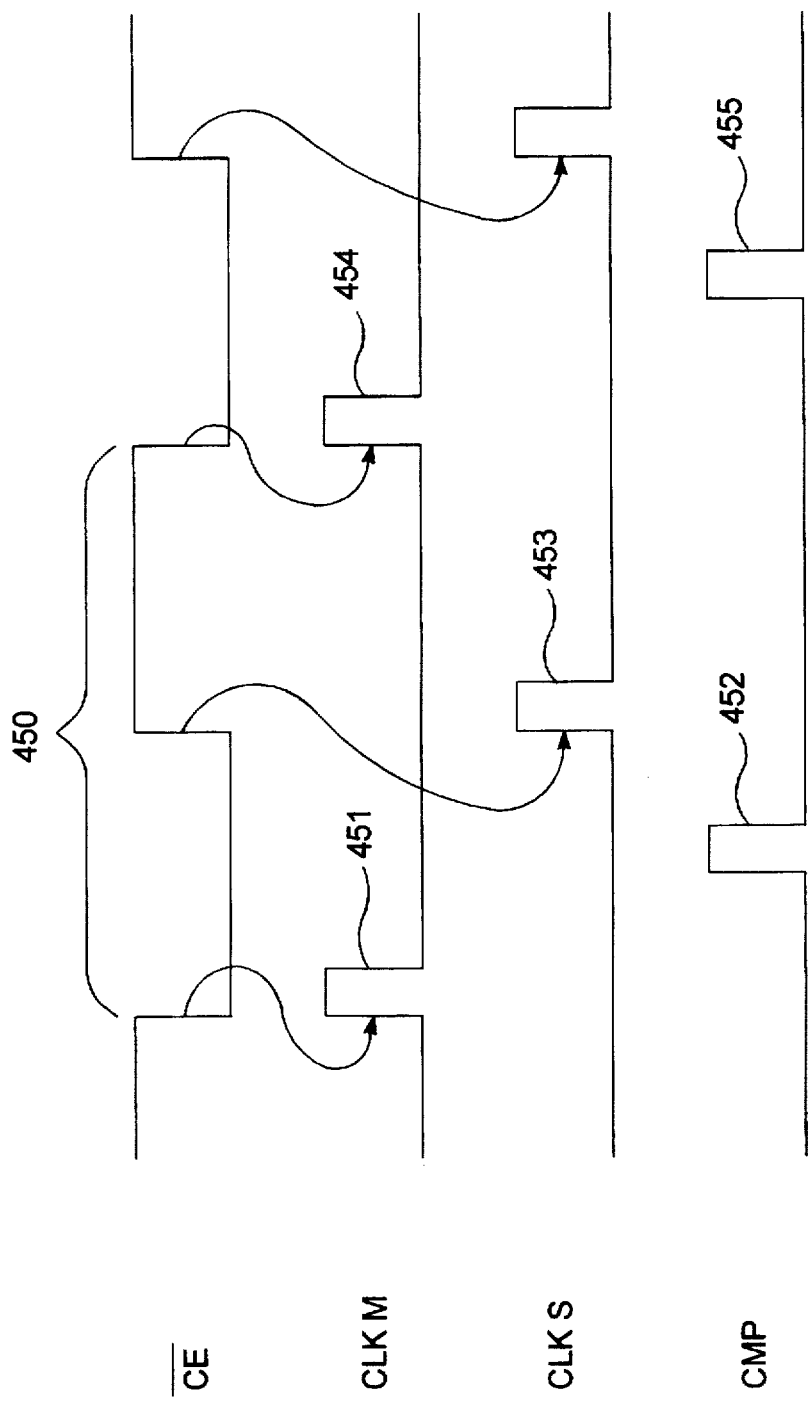
FIG. 6 is a timing diagram for the control signals used in the system of FIGS. 4 and 5.

With reference to FIGS. 4, 5, and 6, pattern match logic and timing diagrams for the incoming address and data stream are described. The logic of FIGS. 4 and 5 is applied here is applied to an address input buffer. Identical circuitry can be used with a data input buffer when data matching is required, and will not be not described again. Thus, as shown in FIG. 4, an address input pad 400 is included on the chip. The signal on the pad 400 is supplied to an address buffer 401. The output of the address buffer is the address bit A(i) on line 402. The address pad 400 is also connected through a pass gate 403 which is controlled by the signal CLKM. The output of the pass gate 403 is supplied to a latch made up of inverters 404 and 405. The output of the latch is supplied through a pass gate 406 which is controlled by the signal CLKS. The output of pass gate 406 is supplied to a latch composed of inverters 407 and 408. The data in the latch made up inverters 407 and 408 is supplied through inverter 409 as a first input to an exclusive NOR gate 410. Also the data in the latch composed of inverters 404 and 405 is supplied through inverter 411 as a second input to the exclusive NOR gate 410. The output of the exclusive NOR gate 410 indicates an address match for the bit supplied on the pad 400, as indicated by the signal ADMTCH (i) on line 412.

All of the address match signals ADMTCH 0 through N-1 (where N is the number of address bits) are supplied to the circuitry shown in FIG. 5. Thus, the match signals for bits 0 and 1 are supplied to NAND gate 415, and the match signals for bits 2 and 3 are supplied to NAND gate 416. The address match signals for bits 4 and 5 are supplied to NAND gate 417. Address match signals for bits 6 and 7 are supplied to NAND gate 418, and so on, until address match signals for bit N-2 and for bit N-1 are supplied to NAND gate 419. The output of the NAND gates 415 through 419 are supplied to a multiple input NOR gate 420. The output of the NOR gate is supplied through NAND gate 421, which receives as a second input a compare clock signal CMP on line 422. The output of NAND gate 421 is supplied through inverter 423 as a match signal on line 424, which is in turn supplied to the mode logic to indicate the detection of the sequential matching addresses.

The timing of the control signals CLKM, CLKS, and CMP is illustrated in FIG. 6 with reference to the chip enable control signal $\overline{CE}$. Thus, the CLKM signal includes a pulse at the falling edge of the chip enable signal. The signal CLKS includes a pulse at the rising edge of the chip enable signal. The control signal CMP is a pulse issued after the falling edge and before the rising edge of the chip enable signal, beginning after detection of the command sequence to start the autoprogram operation. The signal CMP is disabled during the first address and data loading cycle.

Thus, in a given cycle, such as cycle 450 of the chip enable signal, a current address in the sequence is latched through the pass gate 403 into the latch composed of inverters 404 and 405 in response to the CLKM signal pulse 451. Between the falling edge and the rising edge, the CMP pulse 452 is issued which causes comparison of the address match signals, to occur between a previous address, and the current address which has just been latched. On the rising edge of the chip enable signal, the current address is shifted through the pass gate 406 in response to the CLKS pulse 453 into the latch composed of inverters 407 and 408. On the following falling edge the CLKM pulse 454 is issued. This causes the current address to be stored in the latch composed of inverters 404 and 405, while the previous address in the stream is stored in the latch composed of inverters 407 and 408. The current and the previous addresses are compared in response to the CMP signal pulse 455.

Although the logic of FIGS. 4 and 5 is shown for the address signals, the same logic is used for data signals, if the pattern to be detected includes matching segments of data in the stream.

This logic can be adapted as known in the art to detect a variety of patterns of data occurring in the address and data stream which suits the needs of the particular implementation. Furthermore, the latch composed of inverters 407 and 408 might be replaced by a non-volatile store which holds a bit of a command address as discussed above, which falls outside the address space used in the program load operation, to be matched with the incoming data stream.

Figure 7:
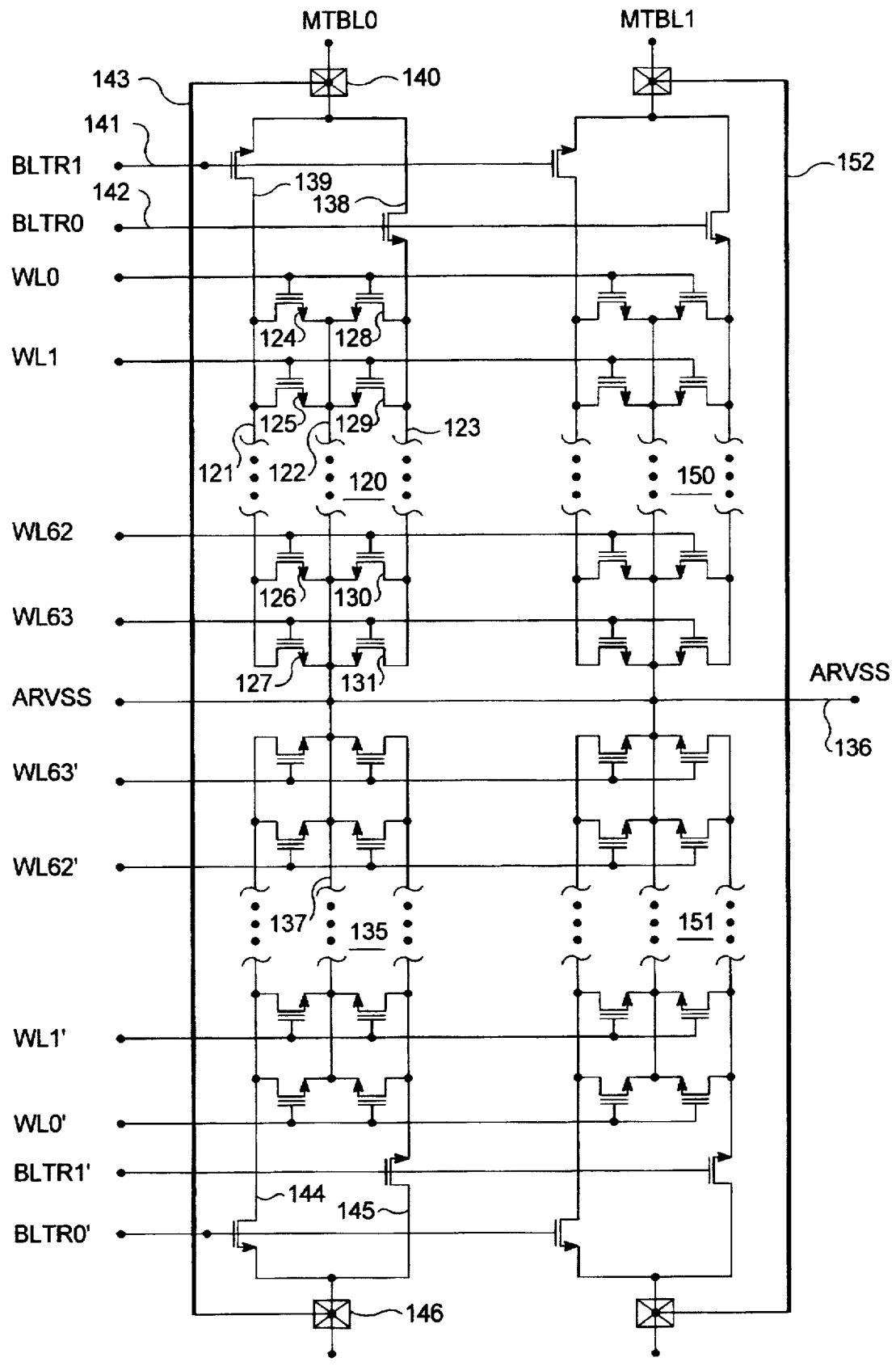
FIG. 7 is a circuit diagram of a floating gate memory array which can be used in the system of the present invention.

FIG. 7 illustrates an architecture of a segmentable flash EEPROM array according to the present invention, in which two columns of flash EEPROM cells share a single metal bit line. FIG. 7 shows four pairs of columns of the array, where each pair of columns includes flash EEPROM cells in a drain-source-drain configuration.

Thus, the first pair 120 of columns includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. As shown in the figure, a first pair 120 of columns includes one column including cell 124, cell 125, cell 126, and cell 127. Not shown are cells coupled to word lines WL2 through WL61. The second one of the pair 120 of columns includes cell 128, cell 129, cell 130, and cell 131. Along the same column of the array, a second pair 135 of columns is shown. It has a similar architecture to the pair 120 of columns except that it is laid out in a mirror image.

Thus, as can be seen, the transistor in the first one of the pair of columns, such as in the cell 125, includes a drain in drain diffusion line 121, and a source in the source diffusion line 122. A floating gate overlays the channel region between the first drain diffusion line 121 and the source diffusion line 122, and the word line WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a drain in the drain diffusion line 121, a source coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

The architecture shown in FIG. 7 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash EEPROM cells comprising M word lines and 2N columns. The array requires only N metal bit lines each of which is coupled to a pair of columns of flash EEPROM cells through select circuitry, as described above.

Although the figure only shows four column pairs 120, 135, 150, and 151, coupled to two metal bit lines 143 and 152 (MTBL0-MTBL1), the array may be repeated horizontally and vertically as required to establish a large scale flash EEPROM memory array. Thus, column pairs 120 and 150 which share a word line are repeated horizontally to provide a segment of the array. Segments are repeated vertically. A group of segments (e.g., eight segments) having respective word lines coupled to a shared word line driver may be considered a sector of the array.

The layout of the array is compact because of the virtual ground configuration, the reduced metal pitch requirement for the layout, and further by the ability to share word line drivers amongst a plurality of rows in different segments. Thus, word line WL63' may share a word line driver with word line WL63. In a preferred system, eight word lines share a single word line driver. Thus, only the pitch of one word line driver is needed for each set of eight rows of cells. The additional decoding provided by the left and right select transistors (139, 138 for segment 120) allows the shared word line configuration. The shared word line configuration has the disadvantage that during a sector erase operation, eight rows of cells all receive the same word line voltage, causing a word line disturbance in cells that are not desired to be erased. If it is a problem for a given array, this disturbance problem can be eliminated by insuring that all sector erase operations decode for segments including all rows of cells coupled to the shared word line drivers. For eight word lines sharing a single driver, a minimum sector erase of eight segments may be desired.

Figure 8:
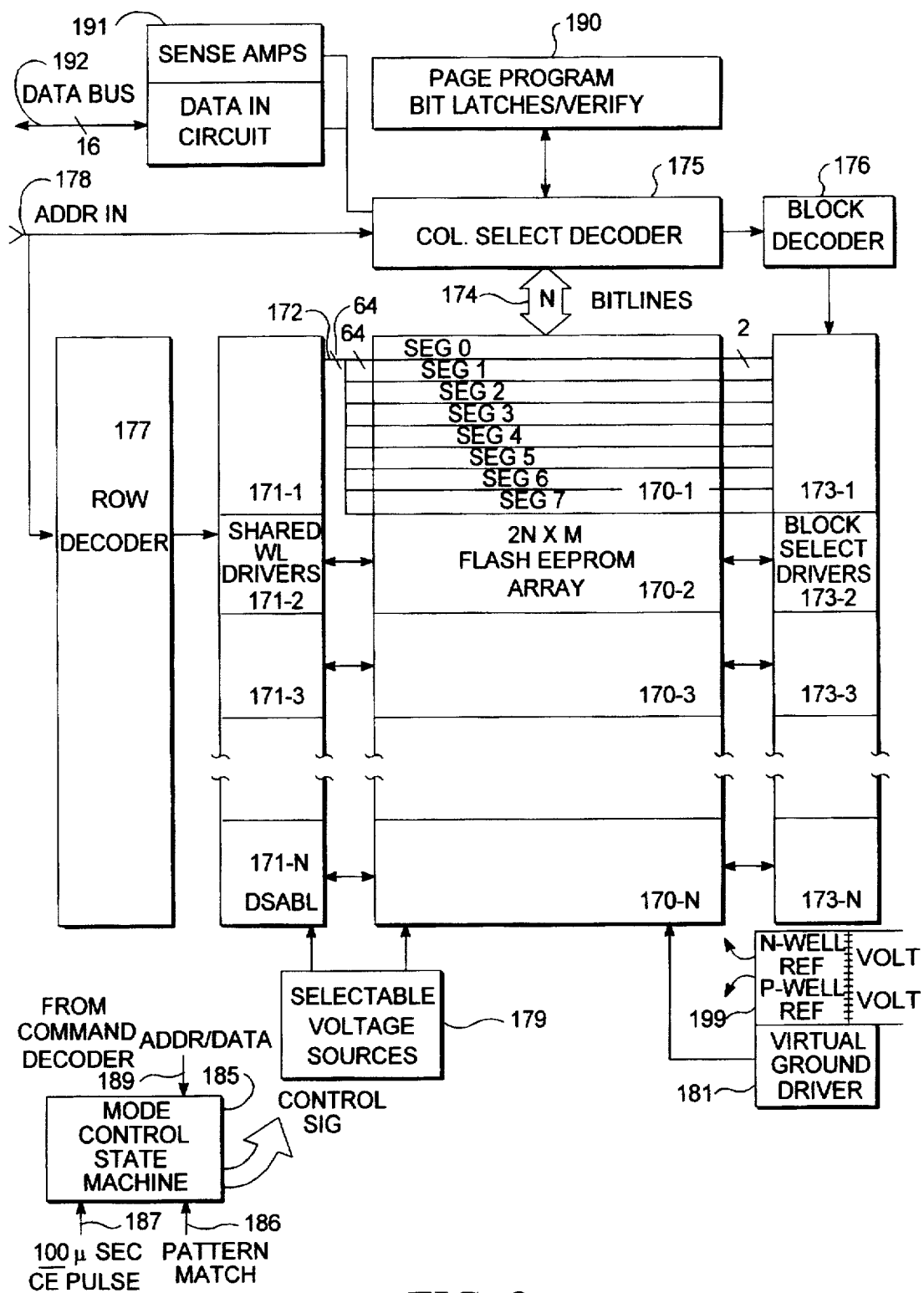
FIG. 8 is a block diagram of a flash EEPROM array including page program buffers and a mode control state machine including the protocol of the present invention.

FIG. 8 is a schematic block diagram of a flash EEPROM array including a page mode programming function meant to illustrate certain features of the present invention. Thus, the flash EEPROM memory module shown in FIG. 8 includes a main flash EEPROM array, including sectors 170-1, 170-2, 170-3, 170-N, each sector including eight segments (e.g., SEG0–SEG7). A plurality of sets of shared word line drivers 171-1, 171-2, 171-3, 171-N are used to drive the shared word lines of the eight segments in the respective sectors. As illustrated with respect to shared word line drivers 171-1, there are 64 shared drivers for sector 170-1. Each of the 64 drivers supplies an output on line 172. Each of these outputs is used to drive eight word lines in respective segments of the sector 170-1 as schematically illustrated in the figure by the division into eight sets of 64 lines.

Also coupled to the array are a plurality of block select drivers 173-1, 173-2, 173-3, 173-N. The block select drivers each drive a left and right block select signal for each segment. Where the segments are implemented as shown in FIG. 7, there is a BLTR1 and BLTR0 block select signal pair supplied for each set of 64 word lines.

In addition, there are N global bit lines in the flash EEPROM array. The N global bit lines are used to allow access to the 2N columns of flash EEPROM cells in the array for the data in circuitry and sense amps 191. The column select decoder 175 is coupled to the page program bit latches/verify block 190, including at least one bit latch for each of the N bit lines. Also, the column select decoder 175 is coupled to the data in circuitry and sense amps 191. Data bus line 192 is 16 bits wide and provides input data to the data in circuitry and sense amps 191. Data bus line 192 also provides 16 bits of output data. Together, these circuits provide data in and out circuitry for use with the flash EEPROM array.

The N bit lines 174 are coupled to a column select decoder 175. In a preferred system, N=1024 for a total of 1024 bit lines. The block select drivers 173-1 through 173-N are coupled to a block decoder 176. The shared word line drivers 171-1 through 171-N are coupled to row decoder 177. The column select decoder 175, block decoder 176, and row decoder 177 receive address signals on the address in line 178.

Coupled to the column select decoder 175 is page program bit latches/verify block 190. The page program bit latches/verify block 190 includes a page buffer having N latches, one for each of the N bit lines. Thus, a page of data may be considered N bits wide, with each row of cells two pages, page 0 and page 1, wide. Pages in a given row are selected using the left and right decoding described above. The page program bit latches/verify block 190 includes program verify circuitry for data stored in the N bit latches and the N bits wide page of data programmed to a selected row of cells in the array. An example of this circuitry is described below.

Selectable voltage sources 179 are used to supply the reference potentials for the read, program, and erase modes for the flash EEPROM array as conceptually illustrated in the figure, through the word line drivers 171-1 to 171-N and through the bit lines.

The virtual ground lines in the array are coupled to the virtual ground driver 181 providing potentials for the various modes to the virtual ground terminals in the array. Also, p-well and n-well reference voltage sources 199 are coupled to the respective wells of the array.

Thus, as can be seen in FIG. 8, the 64 word line drivers, such as word line drivers 171-1, are used with 512 (64×8) rows in the array. The additional decoding provided by the block select drivers (e.g., 173-1) allows for the shared word line layout.

The cells in the preferred embodiment are configured for a sector erase operation that causes charging of the floating gate (electrons entering the floating gate) such that upon sensing, an erased cell, is non-conducting. Also, the architecture is configured for a page program which involves discharging a floating gate (electrons leaving the floating gate) such that upon sensing, a programmed cell is conducting.

Also shown in FIG. 8 is a mode control state machine 185, which controls operation of the device for reading, programming, and erasing. The inputs to the mode control state machine, such as described above with respect to FIG. 1, include the pattern match signal on line 186. Also, an input on line 189 is supplied from the command address/data decoder as mentioned before. This provides for detecting the end of a program load cycle in an automatic program operation using the page program bit latches/verify circuitry, in response to the pattern match signal on line 186. For compatibility, a 100 microsecond chip enable pulse can be indicated as pointed out by line 187. However, this may not be necessary for a particular implementation.

The operation voltages for the programming operation are positive 6 volts to the drain of a cell to be programmed to a low (data=0) threshold condition, negative 8 volts to the gate, and 0 volts or floating of the source terminal. The substrate or the p-well of the cell is grounded. This results in a Fowler-Nordheim tunneling mechanism for discharging the floating gate.

The erase operation is executed by applying negative 8 volts to the source, and positive 12 volts to the gate, with the drain left floating. The p-well is biased at negative 8 volts. This results in a Fowler-Nordheim tunneling mechanism to charge the floating gate. The read potentials are 1.2 volts on the drain, 5 volts on the gate, and 0 volts on the source. This sets up the ability to do a sector erase using word line decoding to select cells to be erased. The erase disturbance condition for unselected cells within a segment results in −8 volts on the drain, 0 volts on the gate, and −8 volts on the source. This is well within the tolerances of the cells to withstand these potentials without causing significant disturbance of the charge in the cell.

Similarly, the program disturbance conditions, for cells which share the same bit line in the same segment are 6 volts on the drain, 0 volts on the gate (or optionally 1 volt), and 0 volts or floating on the source. There is no gate to drain drive in this condition and it does not disturb the cell significantly.

For cells which share the same word line but not the same bit line or an addressed cell which is to remain in a high condition, the disturbance condition is 0 volts on the drain, −8 volts on the gate, and 0 volts or floating on the source. Again, this condition does not result in significant deterioration of the charge in the unselected cells.

In an alternative, hot electron injection may be used for charging up the floating gate by applying high positive voltages to the gate and drain, and a low voltage to the source.

The page program bit latch/verify block 190 of FIG. 8 includes program verify circuitry which resets on a bit by bit basis, the data in the page buffer that passes verify.

Figure 9:
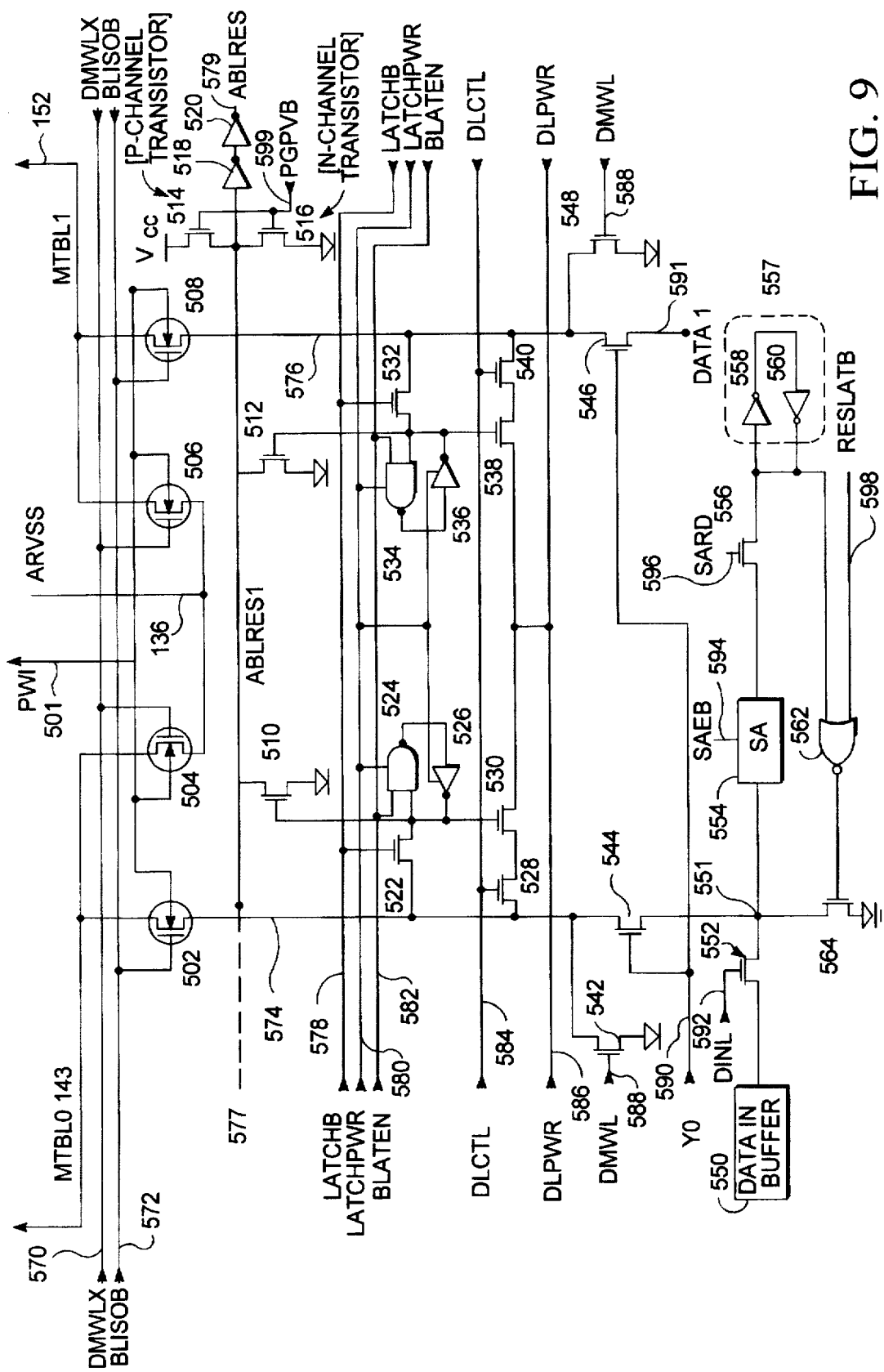
FIG. 9 is a logic diagram of the page buffer bit latches in the system of FIG. 8.

FIG. 9 is a schematic diagram of a section of the page program and automatic verify circuitry in the block 190 for two bit lines MTBL0 143 and MTBL1 152. Metal line 143 (MTBL0) of FIG. 9 corresponds to metal line 143 (MTBL0) of FIG. 7. Metal line 152 (MTBL1) corresponds to metal line 152 (MTBL1) of FIG. 7. Array virtual ground 136 (ARVSS) of FIG. 9 corresponds to the array virtual ground 136 (ARVSS) of FIG. 7. The signal PWI on line 501 is coupled to the p-well of transistors 502, 504, 506, and 508. Each pair of bitlines in the array has a similar structure coupled to it.

Referring to FIG. 9, the drain of transistor 502 and the drain of transistor 504 are coupled to the metal line 143 (MTBL0). The drain of transistor 506 and the drain of transistor 508 are coupled to the metal line 152 (MTBL1). The source of transistor of 504 and the source of transistor of 506 are coupled to the array virtual ground 136 (ARVSS). Signal DMWLX on line 570 is coupled to gate of transistor 504 and gate of transistor 506. When signal DMWLX on line 570 is active, the array virtual ground line 136 (ARVSS) is coupled to the metal line 143 (MTBL0) and the metal line 152 (MTBL1) via transistor 504 and transistor 506, respectively.

Data I/O line 574 is coupled to the source of transistor 502. Data I/O line 576 is coupled to the source of transistor 508. Signal BLISOB on line 572 is coupled to the gate transistor 502 and the gate of transistor 508. When signal BLISOB is high, metal line 143 is coupled to data I/O line 574 via transistor 502, and metal line 152 is coupled to data I/O line 576 via transistor 508.

Data I/O line 574 is coupled to the drain of transistor 542. The source of transistor 542 is coupled to ground, and the gate of transistor 542 is coupled to signal DMWL on line 588. The data I/O line 574 is pulled down when the signal DMWL is high.

Data I/O line 574 is further coupled to the drain of column select transistor 544. The source of transistor 544 is coupled to node 551. The gate of transistor 544 is coupled to signal Y0 on line 590.

A data-in buffer 550 is coupled to the source of pass gate 552. The drain of pass gate 552 is coupled to node 551. Pass gate 552 is controlled by signal DINL on line 592.

Sense amp 554 is also coupled to node 551. Sense amp 554 is controlled by signal SAEB on line 594. The output of sense amp 554 is coupled to the drain of pass gate 556. The source of pass gate 556 is coupled to latch circuit 557. Pass gate 556 is controlled by signal SARD on line 596.

The latch circuit includes inverters 558 and 560. The input of inverter 558 is coupled to the source of pass gate 556. The output of inverter 558 is coupled to the input of inverter of 560, and the output of inverter 560 is coupled to the source of pass gate 556. The output of latch circuit 557 is also coupled to a first input to NOR gate 562. A second input to NOR gate 562 is coupled to signal RESLATB on line 598. The output of NOR gate 562 is coupled to the gate of transistor 564. The drain of transistor 564 is coupled to node 551, and the source is coupled to ground.

Data I/O line 576 which is coupled through transistor 508 to bit line 152 is connected in a similar manner. Thus, line 576 is coupled to the drain of transistor 548. The source of transistor 548 is coupled to ground, and the gate is coupled to signal DMWL on line 588. The drain of transistor 546 is also coupled to data I/O line 576. Signal Y0 is coupled to the gate of transistor of 546. The source of transistor 546 is coupled to node 591 which corresponds to node 551 for the other side. For simplicity, a corresponding set of DIN buffer 550, sense amp 554, latch circuit 557 and associated circuits coupled to node DATA1 591 are not shown. In operation, circuits similar to DIN buffer 550, pass gate 552, sense amp 554, pass gate 556, latch circuit 557, NOR gate 562, and transistor 564 are similarly configured and coupled to node DATA1 591.

Each data I/O line 574, 576 has a bit latch/verify logic circuit coupled to it, comprised generally of the NAND gate 524 and inverter 526 for data I/O line 574, and of NAND gate 534 and inverter 536 for data line I/O 576. For data I/O line 574, the drain of pass gate 522 is coupled to data I/O line 574, and the source of pass gate 522 is coupled to a first input of NAND gate 524. A second input to NAND gate 524 is coupled to signal BLATEN on line 582. The output of NAND gate 524 is coupled to the input of inverter 526. The input power for NAND gate 524 and inverter 526 is coupled to signal LATCHPWR on line 580. Signal LATCHB on line 578 is coupled to the gate of pass gate 522. The output of inverter 526 is coupled to the first input of NAND gate 524, the gate of transistor 510, and the gate of transistor 530. The drain of transistor 510 is coupled to signal ABLRES1 on line 577. The source of transistor 510 is coupled to ground. The drain of transistor 530 is coupled to signal DLPWR on line 586. The source of transistor 530 is coupled to the drain of transistor 528. The gate of transistor 528 is coupled to signal DLCTL on line 584, and the source of transistor 528 is coupled to data I/O line 574.

The data=1 state latched in latch circuitry 524 and 526 pulls down signal ABLRES1 on line 577. The logic high level enables transistor 510 which causes a logic low level on line 577. When transistor 510 is enabled, line 577 is coupled to ground which causes signal ABLRES1 to a logic low level. Transistors 514 and 516 comprise an inverter, which, together with transistors 510 and 512, provides a NOR logic function. Transistor 514 is a p-channel transistor with the source coupled to Vcc and the drain coupled to the drain of n-channel transistor 516. Line 577 is coupled to the drains of transistors 514 and 516. The source of n-channel transistor 516 is coupled to ground, and the gates of transistors 514 and 516 are coupled to signal PGPVB on line 599. Inverters 51 8 and 520 are coupled in series. Line 577 provides the input to inverter 518. The output of inverter 518 provides the input of inverter 520, and the output of inverter 520 provides signal ABLRES on line 579. Thus, whenever latch circuitry 524 and 526 stores a logic high level, signal ABLRES is a logic low level. Transistor 514 provides a pull-up to line 577 which can be driven to a logic low level by enabling either transistor 510 or transistor 512.

The purpose of transistor 516 is that during default state PGPVB on line 599 is "HIGH", and all the gates of transistors 510, 512 . . . are low, so that if there is no transistor 516, ABLRES1 on line 577 is floating. Transistor 516 is added to help line 577 to pull low in this case. During active mode, which is program-verify period during page program mode, PGPVB on line 599 is active "LOW", transistor 516 is off and transistor 514 provides a pull-up to line 577.

A mirrored arrangement of circuits also controlled by signals LATCHB, LATCHPWR, BLATEN and DLCTL are coupled to data I/O line 576. The drain of pass gate of 532 is coupled to data I/O line 576. The gate of pass gate 532 is coupled to signal LATCHB on line 578. The source of pass gate 532 is coupled to a first input to NAND gate 534. A second input to NAND gate 534 is coupled to signal BLATEN on line 582. The output of NAND gate 534 is coupled to the input of inverter 536. Signal LATCHPWR on line 580 provides input power to NAND gate 534 and inverter 536. The output of inverter of 536 is coupled to the first input of NAND gate 534, the gate of transistor of 512, and the gate of transistor 538. Signal DLPWR on line 586 is coupled to the drain of transistor 538. The source of transistor 538 is coupled to the drain of transistor 540. The gate of transistor of 540 is coupled to signal DLCTL on line 584, and the source of transistor 540 is coupled to data I/O line 576. The source of transistor 512 is coupled to ground and the drain of transistor 512 is coupled to line 577.

In operation, the page program and automatic verify circuit of the flash EEPROM array as shown in FIG. 9 executes the page program and program verify in a series of stages. The stages can be generalized as a (1) data loading stage; (2) data program stage; (3) read the array data stage; (4) reset bit latch stage; and (5) retry stage. The operation of the page program and automatic verify of the flash EEPROM array is described with reference to data I/O line 574. Page program and automatic verify are similarly performed using data I/O line 576 that is coupled to another memory cell. Furthermore, the page program and automatic verify circuit includes similar circuitry for all data I/O lines needed to program a page of memory cells in the flash EEPROM array.

In the data loading stage, signal LATCHPWR on line 580, signal LATCHB on line 578, and signal BLATEN on line 582 are supplied with 5 volts to activate data latch circuitry 524 and 526 for operation. Signal LATCHPWR on line 580 supplies voltage to NAND gate 524 and inverter 526 for operation. Signal BLATEN on line 582 enables latch circuitry 524 and 526 to receive inputs. Signal LATCHB on line 578 enables pass gate 522 to couple data I/O line 574 with the first input of NAND gate 524. Signal BLISOB on line 572 is at a logic low level which disables transistor 502. Disabling transistor 502 isolates data I/O line 574 from the metal line 143 (MTBL0). Signal DLCTL on line 584 is at a logic low level which disables pass gate 528. Signal DLPWR is at a logic high level having a voltage of Vcc that is approximately 5 volts. Signal DMWI, on line 588 is at a logic low which prevents transistor 542 from coupling data I/O line 574 to ground. Signal Y0 on line 590 is a logic high level which enables transistor 544 to conduct. Signal Y0 is a decoded signal which enables data I/O line 574 to access a corresponding one of 16 DIN buffers (e.g. buffer 550) during the data loading stage. Signal DINL on line 592 is a logic high which enable pass gate 552. Input data from DIN buffers 550 is transferred via pass gate 552 to data I/O line 574.

Once input data is transferred to data I/O line 574, the data from DIN buffer 550 is transferred to the first input of NAND gate 524. If data from DIN buffer 550 is a logic high level, the logic high level received at the first input of NAND gate 524 causes a logic low output. The logic low output of NAND gate 524 provides the input to inverter 526 which provides a logic high output. NAND gate 524 and inverter 526 comprise the bit latch circuitry which latches the data received at the first input of NAND gate 524. The logic high level at the output of inverter 526 enables pass gate 530 and transfers signal DLPWR on line 586 to pass gate 528. However, during the data loading stage, signal DLCTL on line 584 is a logic low which disables pass gate 528 from conducting signal DLPWR to data I/O line 574.

In the other case, when data from DIN buffer 550 is a logic low level, the logic low level received at the first input of NAND gate 524 causes a logic high output. The logic high output of NAND gate 524 provides the input to inverter 526 which provides a logic low output that is stored in latch circuitry 524 and 526. The logic low at the output of inverter 526 disables pass gate 530 and the transfer of signal DLPWR on line 586 via pass gate 528 to data I/O line 574. Thus, the bit latch circuit of NAND gate 524 and inverter 526 stores either the logic high level or the logic low level of the input data which corresponds to the data transferred from DIN buffer 550.

The bit latches for up to the entire page of 1024 bits are loaded in 16 bit segments relying on the protocol outlined above to detect the last 16 bit segment in the block. Bit latches not loaded are set to zero. Once the input data from DIN buffers 550 is loaded into bit latch circuitry 524 and 526 after the data loading stage, a verify sequence is executed followed by the data write stage. The pre-writing verify loop (according to the sequence described below) prevents over programming cells into depletion such as if a user programs the page with the same data twice. A data write occurs when a logic high is stored in the latch circuitry 524 and 526. When a logic high level data=1 state is received from DIN buffer 550, the logic high level is programmed to a cell of the flash EEPROM array during the data write stage. If a logic low level (data=0) is received from DIN buffer 550 and stored in latch circuitry 524 and 526, the data write stage does not program the memory cell of the flash EEPROM.

In the present example, a logic high level (data=1) is transferred from DIN buffer 550 and stored in bit latch circuitry 524 and 526. During the execution of the data write stage, signal LATCHB on line 578 is disabled. Signal LATCHB on line 578 is set to a logic low to disable inputs to latch circuitry 524 and 526. Signal LATCHPWR is set to a high voltage to provide power to latch circuitry 524 and 526. Signal BLATEN on line 582 is set to a high voltage level to enable the output of latch circuitry 524 and 526. Signal BLISOB on line 572 is set to a high voltage level to enable transistor 502. Transistor 502 couples data I/O line 574 to metal line 143. Signal DLCTL on line 584 is set to a high voltage level to enable pass gate 528. Signal DLPWR on line 586 is set to a high voltage. Signal Y0 on line 590 is a logic low level to disable transistor 544. Signal DINL is a logic low level which decouples input data from DIN buffer 550 from data I/O line 574. Signal SAEB is a logic low level to disable sense amp 554.

Once the control signals are properly initialized to perform the data program stage, signal DLPWR on line 586 is transferred to data I/O line 574. Signal DLPWR provides programming power to program a memory cell in the flash EEPROM array. Thus, if latch circuitry 524 and 526 is latched with a data=1 state, pass gate 530 is enabled to permit signal DLPWR to pass through pass gate 528. Signal BLISOB on line 572 enables transistor 502 and couples signal DLPWR to the metal line 143 (MTBL0).

Referring to FIG. 7, enabling signal BLTR1 on line 141 or BLTR0 on line 142 couples a column of cells to the metal line 143 and provides the programming voltage from signal DLPWR to program a particular memory cell 125 or 129 on the word line which is changed to −8 volts. For instance, if BLTR1 on line 141 is selected and word line WLI is selected, the programming voltage from signal DLPWR is directed to memory cell 125.

After the data from latch circuitry 524 and 526 is programmed to the memory cell, the circuitry is ready to verify automatically that the data was properly programmed in the data write stage. This involves a five step sequence (A through E) for deciding whether to reset the bit latch as follows:

Step A

READ the real data from the non-volatile bit through the associated sense amp (all 16 sense amps are activated at the same time, i.e. 16 bits are read at the same time). The sensing result is stored in latch 557 of FIG. 9. For example, in FIG. 9, to verify a selected cell from a specified wordline, BLISOB (572) must be high (ON), selected Y (544, 546 and 14 more of such devices) is on, sense amp (SA) 554 is activated (and 15 other SA), SARD (596) is high to allow the sensing result pass to the latch (557) and LATCHB (578), DLCTL (584) are at low voltage (OFF) so that during this READ step, the bit latch consisting of 524 and 526 will not be disturbed. The selected cell threshold voltage is sensed by the SA (554) via data line 574 and then stored in latch 557, after a certain amount of time which is long enough for the SA (554) to do the sensing. If after programming, the cell's threshold voltage (VT) is low enough (to the point that the SA 554 can tell that the cell is at low VT state) then the output of the inverter (560, or input of 558) will reflect a low level. SARD (596) is off and then SA (544) is disabled. The low level is stored in latch (557), no matter what read happens during the next 4 steps in sequence until the new locations need to be read again. If after programming, the selected cell VT is still read high, then the output of inverter 560 is at high level, i.e. a logic high level is latched in latch 557. Note that RESLATB (598) is HIGH in this step so that whether latch 557 latched high or low will not affect device (564) because device 564 is OFF anyway.

Step B

DISCHARGE DATA LINES (all including selected and deselected) The purpose of this step will be explained in STEP D). The way of discharging the data line 574 is by activating DMWL (588) to high turning on transistors 542 and 548, LATCHB at low, DLCTL at low, with all sense amps disabled, 564 and 552 are off. Transistor 542 discharges charge stored in data line 574. BLISOB (572) is at low level to isolate the long metal-bit-line (MTBL0) from the data line (574) so that the discharge sequence can be achieved faster.

Step C

PRE-CHARGE DATA LINES (selectively, according to the associated bit latch) The purpose of this step will be explained in step D.) During this step, DMWL is at low level, BLISOB is still at low level, whether the selected 16 data lines of the same word and other de-selected data lines should be precharged to a high voltage level or not is decided by the data which is stored in the bit latch. For example, in FIG. 9, during this step LATCHB (578) is still off, DLCTL (584) is switched from low to high, and data line 574 is precharged to a high level by connecting DLPWR (a $V_{cc}$ level power source for this instance) to the data line (574) via devices 530 and 528 if the output of inverter 526 (which is the gate of 530) is latched at HIGH level. Otherwise DLPWR cannot precharge data line 574 to a high level and the data line 574 should be still at a low voltage level due to step B.

Step D

RESET BIT LATCH OR NOT? During this step LATCHB (578) is switched from low level to a high level, and RESLATB (598) switches from high to low in order to reset the bit latch (which consists of NAND gate 524 and inverter 526) by turning on transistor 564, if the output of inverter 560 is (latched) low (from step A). Since the selected cell is at low VT already, the bit latch content shall be reset so that for the next programming, high voltage pulse sequence, the cell which is at low VT shall not be programmed to low VT again. There is a chance that the bit latch had been reset from a previous verify loop step D) or was at reset state even before the first programming sequence. In these cases, the subsequent reset bit latch step is of no effect to the bit latch for the former case; and for the latter case whether the selected cell is at high VT or not will not affect the bit latch because if the cell is at high VT, there is no resetting the bit latch (transistor 564 is OFF, from Steps A and D) and bit latch was at reset state. If the cell was at low VT, then resetting the bit latch again makes no difference to the contents of the bit latch. There is no comparison circuit needed in this implementation.

Note that LATCHB is a global signal to all the bit latches in the FLASH EEPROM design and the high level at the gates of 522, 532 . . . results in all bit latches being coupled to the associated data lines which means that the node of the output of inverter 526 will encounter a charge sharing with the associated data line (574, for example). The driving capability of inverter 526 is designed to be a weak device in order that a proper data can be set (to fight against inverter 526) into the bit latch. So when LATCHB (578) is HIGH, weak inverter (526) suffers a charge sharing issue which results in the uncertainty of the integrity of the bit latch.

The purpose of steps B) and C) is to put the proper voltage level at the data lines before getting into step D), i.e. before LATCHB (578) switches from low to high to avoid any "charge sharing issues", even though the circuitry can be designed as mentioned above to ensure proper operation without them. During step B), all data lines are discharged to low level and then at step C) only those data lines whose associated bit latches "stored" high level will be precharged to a high level. Thus steps B) and C) are optional steps inserted here for safety in the design.

Step E

DISCHARGE ALL DATA LINES AGAIN. At this moment, the program-verify activity is pretty much done; however, before moving into the next word for programming-verifying (or more precisely, to change the new word and repeat from step A) to step D)),the logic control will remove residue charges from all the data lines and switch to new word. For example, during this step, LATCHB (578) is at LOW level, RESLATB (598) is at HIGH level, DMWL (588) is at HIGH level and BLISOB (572) is at HIGH level.

Thus, the page program and automatic verify circuit of FIG. 9 provides the unique feature of automatically verifying a memory cell that is programmed. Latch circuitry 524 and 526 stores the input data received from DIN buffer 550. The stored data in latch circuitry 524 and 526 controls ABLRES1 which is set to a logic low level if there is at least one cell which needs to be programmed. Signal ABLRES I remains a logic low level until all the page memory cells are verified during the program verify sequence which resets all latches (524 and 526) to a logic low level and resets signal ABLRES1 to a logic high level indicating a properly programmed memory cell. The program verify sequence is automatic.

Signal PGPVB on line 599 is a logic low level to supply a charge to line 577 during automatic verify sequence. When latch circuitry 526 and 524 is reset, transistor 510 is disabled and the charge on line 577 is no longer discharged to ground. Signal ABLRES1 on line 577 becomes a logic high level. The logic high level provides an input to inverter 518 which produces an output that provides an input to inverter 520 which provides the logic high level output of signal ABLRES on line 579. The logic high level of signal ABLRES on line 579 provides a page programmed verify signal signifying the page of memory cells has passed program verify.

Each memory cell within a page of memory cells in the array is able to activate a transistor 510 to cause signal ABLRES1 on line 577 to be a logic low level. Thus, any memory cell that does not pass program verify within a page of memory cells in the array can cause the output ABLRES to be a logic low level. The logic low level of ABLRES on line 579 signals that at least one memory cell within the page of memory cells in the array is not properly programmed and verified. Thus, any memory cell not properly verified can cause signal ABLRES on line 579 to be a logic low level. When all memory cells are properly programmed and verified, signal ABLRES on line 579 is a logic high level.

In operation, unsuccessfully programmed memory cells are reprogrammed and reverified until signal ABLRES becomes a logic high level. The number of retries are limited to prevent looping of the programming sequence if a page repeatedly fails program verification.

Figure 10:
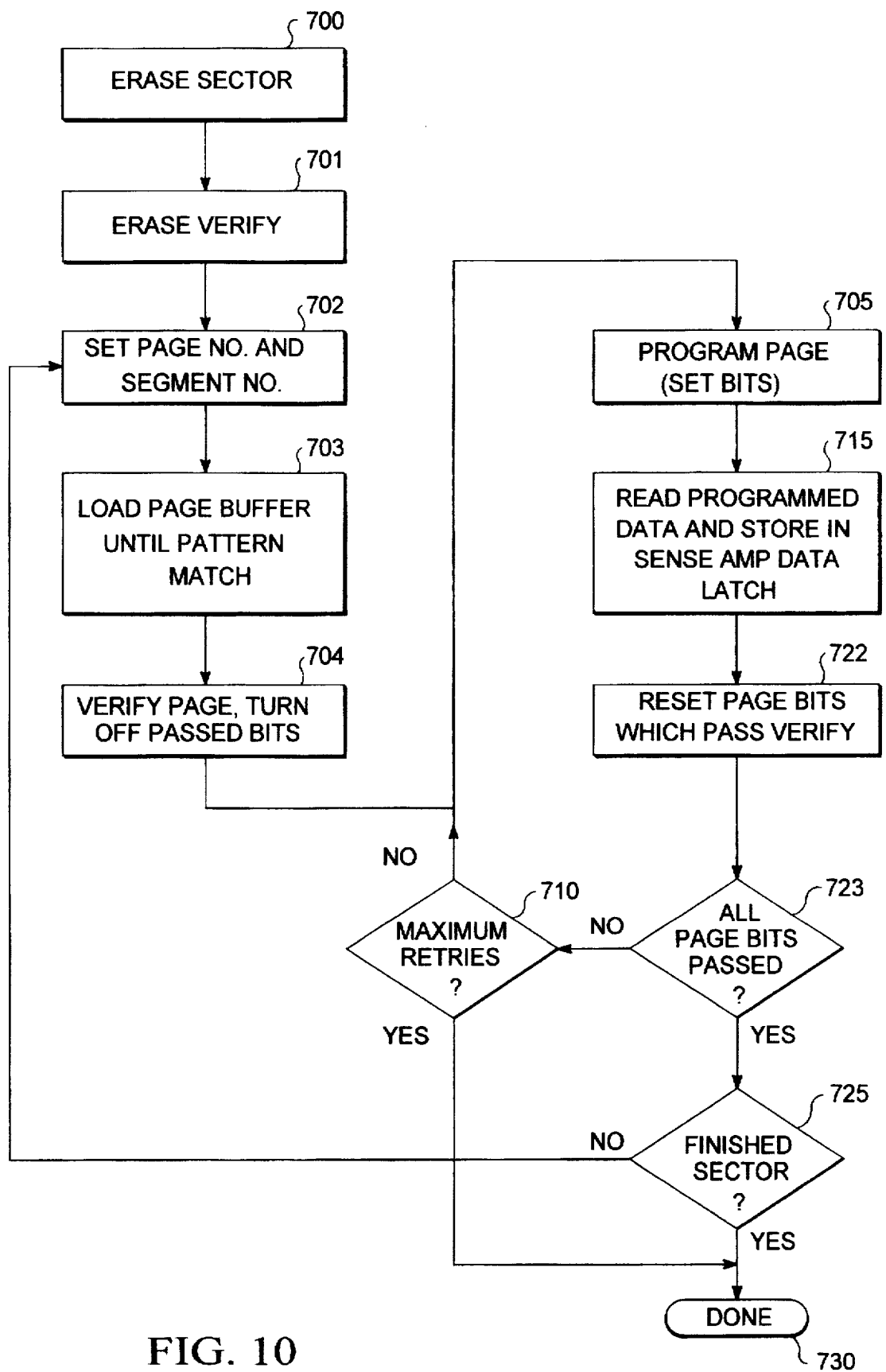
FIG. 10 is a flow chart for the program operation according to the present invention.

FIG. 10 provides a flow chart illustrating the program flow for the flash EEPROM circuit of FIG. 9. The process begins by erasing the sector (e.g., sector 170-1) into which data is to be programmed (block 700). After erasing the sector, an erase verify operation is executed (block 701). Next, the page number, either 0 or 1, and the segment number, 1–8, is set by the host processor in response to the input address (block 702).

After setting the page number and segment number, the page buffer is loaded with a block including from one byte up to a full page (block 703). The page buffer may be loaded with an entire page of data, or a single byte of data, as suits a particular program operation. The end of the load portion of the autoprogram cycle is indicated by the pattern match described above. Next, a verify operation is executed, in case the user does not pre-erase, or tries to reprogram the same data, to determine which cells need programming (block 704). After loading the page buffer, the program potentials are applied to the segment being programmed (block 705). After the program page operation, a verify operation is executed in which the page is verified. In the verify operation, the programmed page is read and each corresponding read bit of data is stored in a sense amp data latch (block 715).

The page bits which pass verify are reset (block 722). Next, the algorithm determines whether all page bits are turned off in the page buffer, ie., did all pages bits pass (block 723). If they are not all off, then the algorithm determines whether a maximum number of retries has been made (block 710), and if not, loops to block 705 to program the page again, such that the failed bits are reprogrammed. The bits which pass are not reprogrammed because the corresponding bits in the page buffer were reset to 0 during the verify operation. If the maximum number of retries has been made at block 710, then the algorithm is done (block 730), signaling an unsuccessful operation.

If at block 723, all page bits were off, then the algorithm determines whether the sector has been finished, that is, whether both pages of the sector are to be written and both are completed (block 725). This is a CPU determined parameter. If the sector is not finished, then the algorithm loops to block 702 and updates the appropriate one of the page number or segment number. If the sector has been finished at block 725, then the algorithm is done (block 730).

Accordingly, a new flash EEPROM array architecture with an autoprogram function which detects the end of a load cycle in response to transitions in the address and/or data signals applied to the memory, has been provided. The architecture provides for a very dense core array obtained by unique cell layouts, where two adjacent local drain bit lines share one common source bit line. Also, the layout has been optimized to allow use of a single metal line for every two columns of cells in the array. Further, the layout is further reduced by shared word lines, so that the word line driver pitch does not impact the size of the main array. Sector erase is feasible using segmentable architecture of the present invention. Also, the page program and automatic verify circuitry provides efficient and accurate programming of the memory cells. Thus, a high performance, reliable flash memory array can be achieved using these technologies.

An n-channel embodiment of the flash EEPROM array has been disclosed. Those skilled in the art will recognize that p-channel equivalent circuits can be implemented using techniques known in the art. Furthermore, the architecture has been designed with respect to flash EEPROM cells. Many aspects of the architecture may be adapted to a variety of memory circuit arrays.

In conclusion, the present invention provides a page programmed flash EEPROM device, in which the length of a block of data being stored in a given page program operation can be arbitrarily defined, and which does not require the 100 microsecond pulse to indicate the end of the program load segment of an automatic programming cycle. The system is particularly suitable for high density integrated circuit memories, storing 16 megabits or more of data in a floating gate memory integrated circuit.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An integrated circuit memory, comprising:
   an array of storage elements;
   input/output circuitry, having inputs to receive addresses and data and coupled to the array, to read and store data segments in the array in response to the addresses and the data on the inputs; and
   command logic, coupled to the input/output circuitry, which executes a process to store a block of data in response to a sequence of addresses and data segments received at the input/output circuitry, including logic to detect a last segment of the block of data in response to a pattern including at least one of the addresses and the data received at the input/output circuitry.

2. The memory of claim 1, wherein the pattern includes consecutive matching addresses, and the command logic includes a store for an address and a comparator to compare a received address with the address in the store.

3. The memory of claim 1, wherein the pattern includes consecutive matching addresses and consecutive matching data segments, and the command logic includes a store for an address and a data segment and a comparator to compare a received address and a received data segment with an address and a data segment in the store.

4. The memory of claim 1, wherein locations for data to be stored in the array are identified by addresses within an address range, and the pattern includes a command address outside the address range, and the command logic includes a store for the command address and a comparator to match a received address with the command address in the store.

5. The memory of claim 1, wherein locations for data to be stored in the array are identified by addresses received on the inputs of the input/output circuitry within an address range, the addresses within the address range having a high order segment and a low order segment, and the pattern includes a start command, supplied in the high order segment, comprising a bit pattern outside the address range, supplied after loading of the block of data into the array of storage elements.

6. The memory of claim 1, wherein locations for data to be stored in the array are identified by addresses received on the inputs of the input/output circuitry within an address range, the addresses within the address range having a high order segment and a low order segment, and the pattern includes a load command, supplied in the high order segment, comprising a bit pattern outside the address range, supplied during loading of the block of data into the array of storage elements.

7. The memory of claim 6, wherein the pattern includes changing the high order segment of the received address from the load command to the value within the address range while loading a last data segment in the sequence.

8. The memory of claim 1, wherein the array comprises floating gate memory cells.

9. The memory of claim 1, wherein the command logic includes a state machine which automatically programs and verifies programming of the block of data after the last segment in the block is detected.

10. The memory of claim 1, wherein the array comprises floating gate memory cells, and the input/output circuitry includes a state machine, responsive to the command logic, which automatically programs and verifies programming of the block of data after the last segment in the block is detected.

11. The memory of claim 10, wherein the input/output circuitry includes program/erase voltage sources coupled to the state machine which apply potentials to the floating gate cells which cause Fowler-Nordheim tunneling in cells to be programmed.

12. The memory of claim 10, wherein the input/output circuitry includes program/erase voltage sources coupled to the state machine which apply potentials to the floating gate cells which cause hot electron injection in cells to be programmed.

13. The memory of claim 1, wherein the input/output circuitry receives a control signal establishing timing for the sequence of addresses and data segments, the command logic includes logic to detect a pulse in the control signal having a characteristic pulse width indicating that the block is loaded, wherein the logic includes a state machine, responsive to the command logic, which automatically programs and verifies programming of the block of data after the last segment in the block or the pulse is detected.

14. The memory of claim 1, wherein the pattern comprises an address transition in the sequence of addresses and data segments received at the input/output circuitry.

15. A floating gate memory circuit on a semiconductor substrate comprising:
   a memory array including at least M rows and N columns of floating gate cells;
   M word lines, each coupled to the floating gate cells in one of the M rows of floating gate cells;
   a plurality of bit lines, each coupled to the floating gate cells in at least one of the N columns of floating gate cells;
   input/output circuitry, having inputs to receive addresses and data;
   command logic, coupled to the input/output circuitry, which executes a process to store a block of data in response to a sequence of addresses and data segments received at the input/output circuitry, including logic to detect a last segment of the block of data in response to a pattern including at least one of the addresses and data received at the input/output circuitry;
   a page buffer, coupled to the input/output circuitry to store the block of data and supply the block of data to the N columns of floating gate cells;
   write control circuitry, coupled to the command logic, the page buffer and the M word lines, which after detection of the last segment in the block, supplies programming voltages to a selected word line for programming input data to a row of floating gate cells accessed by the selected word line in response to the block of data stored in the page buffer; and

21 program verify circuitry, coupled to the page buffer, which verifies that floating gate cells are programmed with the block of data in the page buffer.

16. The floating gate memory circuit of claim 15, wherein the page buffer includes a plurality of bit latches coupled to corresponding ones of the plurality of bit lines, and the program verify circuitry, coupled to the bit lines, resets a bit latch to a first binary value when stored data in a floating gate cell on a corresponding bit line matches a second binary value.

17. The floating gate memory circuit of claim 15, wherein:
a row of N columns of floating gate cells includes a first page of floating gate cells and a second page of floating gate cells; and
the page buffer supplies input data to a page of floating gate cells.

18. The floating gate memory circuit of claim 16, wherein the program verify circuitry includes logic responsive to stored data from the floating gate cells and to data in the page buffer to provide a program verify signal when all programmed floating gate cells pass program verify.

19. The floating gate memory circuit of claim 16, wherein the program verify circuitry generates a program verify signal when all bit latches store the first binary value.

20. The floating gate memory circuit of claim 19, wherein the write control circuitry applies a word line program potential to a word line coupled to a selected set of floating gate cells, and a bit line program potential to bit lines coupled to bit latches storing the second binary value.

21. The floating gate memory circuit of claim 15, wherein the pattern includes consecutive matching addresses, and the command logic includes a store, coupled to the input/output circuitry, to hold an address and a comparator, coupled to the input/output circuitry, to compare a currently received address with a previously received address held in the store.

22. The floating gate memory circuit of claim 15, wherein the pattern includes consecutive matching addresses and consecutive matching data segments, and the command logic includes a store, coupled to the input/output circuitry, to hold an address and a data segment and a comparator, coupled to the input/output circuitry, to compare a currently received address and data segment with a previously received address and data segment held in the store.

23. The floating gate memory circuit of claim 15, wherein locations in the array are identified by addresses within an address range, and the pattern includes a command address outside the address range, and the command logic includes a store for the command address and a comparator, coupled to the input/output circuitry, to compare a received address with the command address in the store.

24. The floating gate memory circuit of claim 15, wherein locations for data to be stored are identified by addresses received on the inputs of the input/output circuitry within an address range, the addresses within the address range having a page address segment and a page buffer address segment, and the pattern includes a start command, supplied in the page address segment, comprising a bit pattern outside the address range, supplied after loading of the block of data into the memory array.

25. The floating gate memory circuit of claim 15, wherein locations for data to be stored are identified by addresses received on the inputs of the input/output circuitry within an

22 address range, the addresses within the address range having a page address segment and a page buffer address segment, and the pattern includes a load command, supplied in the page address segment, comprising a bit pattern outside the address range, supplied during loading of the block of data into the memory array.

26. The floating gate memory circuit of claim 25, wherein the pattern includes changing the page address segment of the received address from the load command to the value within the address range while loading a last data segment in the sequence.

27. The floating gate memory circuit of claim 15, wherein the input/output circuitry receives a control signal establishing timing for the sequence of addresses and data segments, the command logic includes logic to detect a pulse in the control signal having a characteristic pulse width indicating that the block is loaded, and wherein the write control circuitry applies program voltages in response to either detection of the last segment in the block or detection of the pulse.

28. The floating gate memory circuit of claim 15, wherein the programming voltages applied to the floating gate cells cause Fowler-Nordheim tunneling in cells to be programmed.

29. The floating gate memory circuit of claim 15, wherein the programming voltages applied to the floating gate cells cause hot electron injection in cells to be programmed.

30. The floating gate memory of claim 15, wherein the pattern comprises an address transition in the sequence of addresses and data segments received at the input/output circuitry.

31. A method for storing a block of data consisting of less than or equal to a page in a floating gate memory device, comprising:
supplying a command which indicates an automatic program operation to the memory device;
after supplying the command, supplying a stream of addresses and segments of data, and storing the supplied segments in a page buffer;
monitoring the supplied stream of addresses and segments of data to detect a pattern in the supplied stream which signals an end of the block of data; and
after detection of the pattern, executing a program operation to store the block of data from the page buffer into the floating gate memory device.

32. The method of claim 31, wherein the pattern includes two matching addresses in sequence in the stream.

33. The method of claim 31, wherein the pattern includes a sequence of two matching addresses and two matching segments of data in the system.

34. The method of claim 31, wherein the pattern includes an address in the stream matching a prespecified command address.

35. The method of claim 31, wherein locations in the floating gate memory device for data to be stored are identified by the stream of addresses within an address range, the stream of addresses within the address range having a page address segment and a page buffer address segment, and the pattern includes a start command, supplied in the page address segment, comprising a bit pattern outside the address range, supplied after loading of the block of data into the floating gate memory device.

36. The method of claim 31, wherein locations in the floating gate memory device for data to be stored are identified by the stream of addresses within and address range, the stream of addresses within the address range having a page address segment and a page buffer segment, and the pattern includes a load command, supplied in the page address segment, comprising a bit pattern outside the address range, supplied during loading of the block of data into the floating gate memory device, the pattern further including a change in the page address segment to a value within the address range.

37. The method of claim 36, wherein the pattern includes changing the page address segment of the received address from the load command to the value within the address range while loading a last data segment in the stream.

38. The method of claim 31, wherein the step of storing includes storing the block of data in parallel.

39. The method of claim 31, further including the step of automatically verifying the storing of the block of data into the floating gate memory device, and retrying the storing if an error is found.

40. The method of claim 31, wherein the pattern comprises an address transition in the stream of supplied addresses and data segments.

* * * * *